United States Patent
Bhandarkar et al.

(10) Patent No.: US 8,141,786 B2
(45) Date of Patent: Mar. 27, 2012

(54) THIN SMART CARD MODULE HAVING STRAP ON CARRIER

(75) Inventors: Sarvotham Bhandarkar, Allen, TX (US); Hoang Hoang, Frisco, TX (US)

(73) Assignee: Texas Instruments Incorporated, Dallas, TX (US)

( * ) Notice: Subject to any disclaimer, the term of this patent is extended or adjusted under 35 U.S.C. 154(b) by 281 days.

(21) Appl. No.: 12/016,815

(22) Filed: Jan. 18, 2008

(65) Prior Publication Data

US 2009/0184166 A1 Jul. 23, 2009

(51) Int. Cl.
*G06K 19/06* (2006.01)

(52) U.S. Cl. .......................... 235/492; 235/487; 438/25

(58) Field of Classification Search .............. 235/492, 235/487; 257/666, 678, 778, 766, 99, 81, 257/100; 438/123, 25; 340/572.1, 572.5, 340/572.7
See application file for complete search history.

(56) References Cited

U.S. PATENT DOCUMENTS

| | | | | |
|---|---|---|---|---|
| 5,606,198 | A * | 2/1997 | Ono et al. | 257/666 |
| 5,756,377 | A * | 5/1998 | Ohsawa | 438/111 |
| 7,500,610 | B1 * | 3/2009 | Hadley et al. | 235/451 |
| 2004/0155114 | A1 * | 8/2004 | Rietzler | 235/492 |
| 2004/0195572 | A1 * | 10/2004 | Kato et al. | 257/72 |
| 2007/0096265 | A1 * | 5/2007 | Wallace | 257/666 |
| 2008/0135869 | A1 * | 6/2008 | Liu et al. | 257/99 |

FOREIGN PATENT DOCUMENTS

EP 641019 A2 * 3/1995

* cited by examiner

*Primary Examiner* — Daniel Hess
*Assistant Examiner* — Tabitha Chedekel
(74) *Attorney, Agent, or Firm* — William B. Kempler; Wade J. Brady, III; Frederick J. Telecky, Jr.

(57) ABSTRACT

A Smart Card module with flip-assembled chip (101) on a metallic strap (112) adhering to an insulating substrate (111). Chip (101) is in the gap (122) of a metal carrier (120), strap (112) conductively attached to the carrier. Carrier (120) is designed to practically surround the chip, and has a thickness about equal to the chip thickness. Overall module thickness is less than 250 μm without dangerously thinning the chip. Additional strength may be acquired by filling any space of gap (122) not occupied by chip (101) with encapsulation compound (150). Metal carrier (120) further provides contact areas (120a, 120b) for higher level system interconnection (stacking of modules).

22 Claims, 5 Drawing Sheets

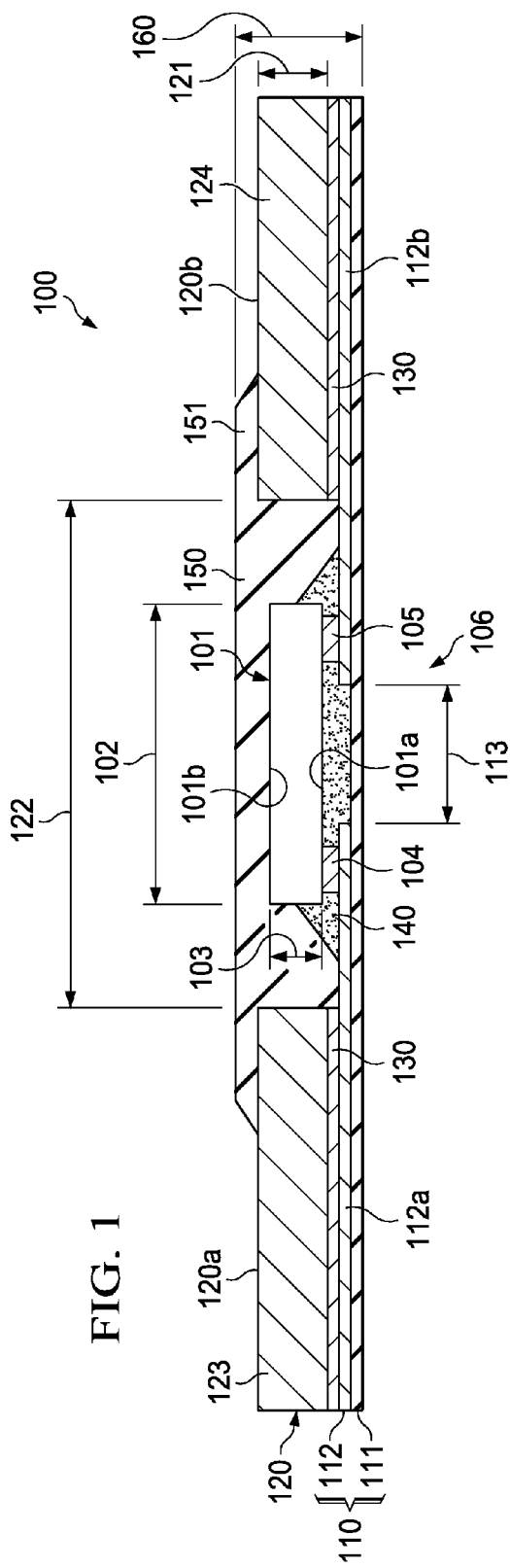

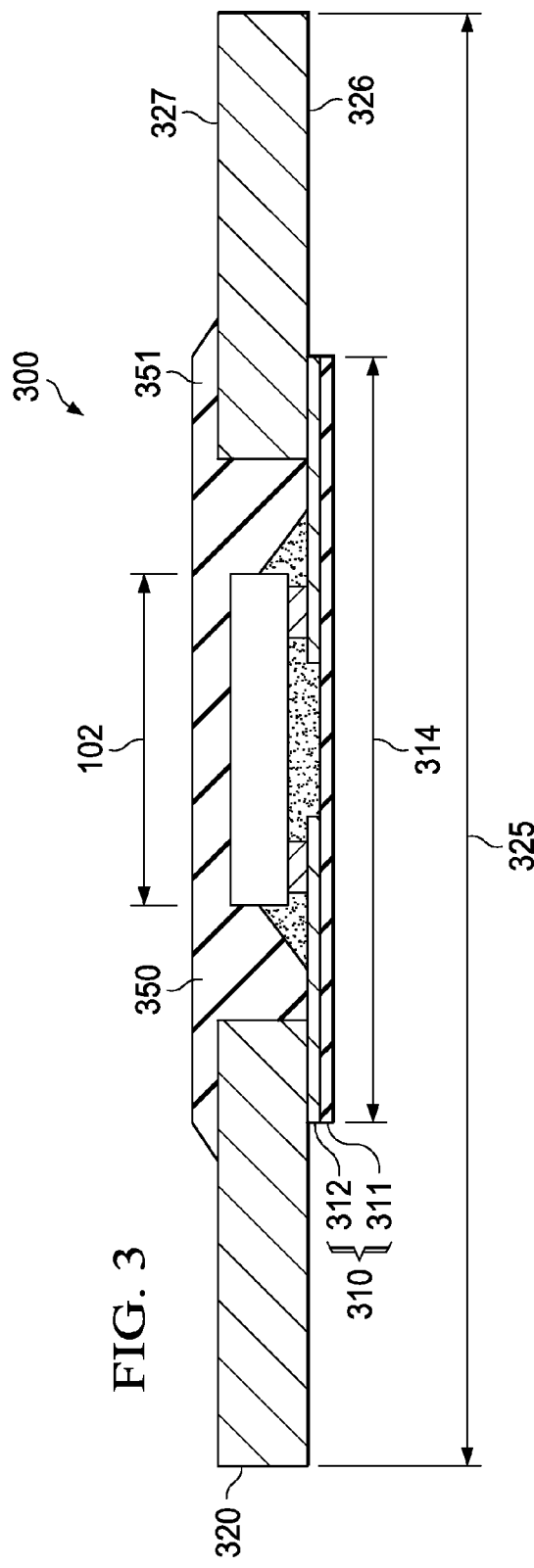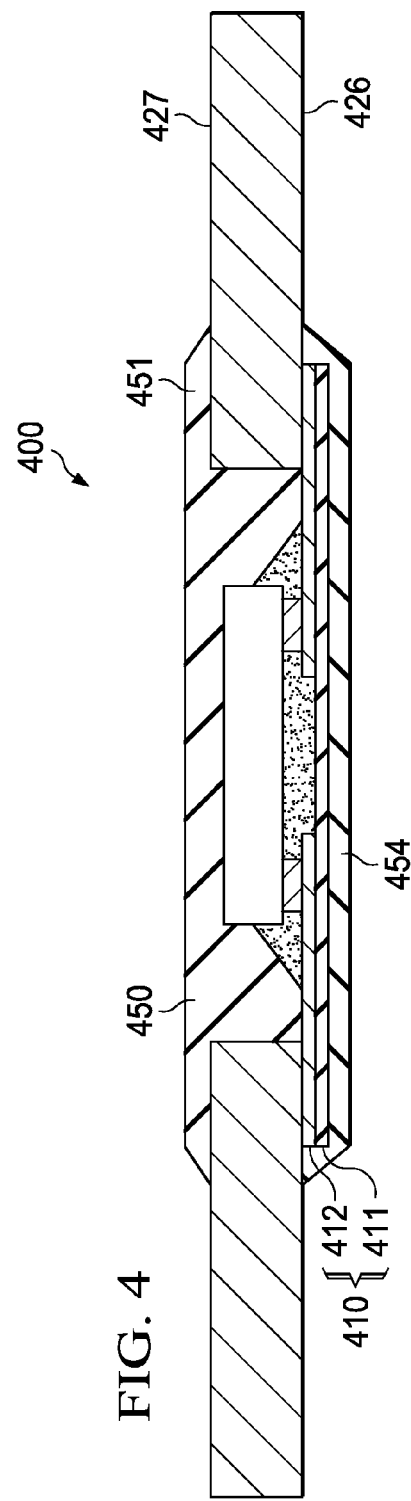

THIN SMART CARD MODULE HAVING STRAP ON CARRIER

FIELD

Embodiments of the invention are related in general to the field of electronic systems and semiconductor devices and more specifically to structure and method of a Smart Card, which combines thinness with robustness and thus exhibits high reliability and offers widespread applications.

DESCRIPTION OF RELATED ART

The Smart Card consists of one or more integrated circuit chips encapsulated in a convenient form to be carried on one's person. The encapsulation may be a bank card, a tag, a key, or a mobile telephone; it may have almost any shape, size and thickness that is convenient for the user to carry, insert, or connect into a device and retrieve. A number of industries produce the diversified Smart Card encapsulations, while the semiconductor industry supplies the modules, in which the semiconductor chips are assembled and packaged.

Driven by wider diversification, Smart Card modules face a relentless application pressure for reducing thickness and overall size, and simultaneously enhancing robustness against mechanical abuse and environmental disturbances. In addition, Smart Card modules are increasingly required to come in designs for easy integration into complex modules, encapsulations and systems. As an example, Smart Card modules may have to be able to stack logic and memory chips, or microprocessor and encryption chips, or they may have to combine temporary and permanent data storage, external data reading and internal data processing, or irreversible and alterable storage circuits.

In conventional technology, Smart Card modules may be manufactured by adhesively attaching a semiconductor chip onto a metallic leadframe and using wire bonds to connect the chip terminals to the leads. In this approach, the extent by which the module thickness can be reduced is limited by chip thickness and wire bond loop height.

Alternatively, when conventional technology uses flip-chip assembly to attach the chip to a substrate, the need for thinness requires the use of thin plastic foils. The foils in turn, render the module mechanically weak and expose the chip to the risk of breakage.

In summary, conventional technology is running into a wall when trying to reduce thickness of Smart Card modules while concurrently enhancing module robustness against mechanical abuse.

SUMMARY

Applicants recognize the need for a paradigm shift in assembling and packaging semiconductor chips in Smart Card modules in order to gain the benefit of reduced module thickness while, at the same time, improving mechanical robustness and environmental insensitivity. Applicants have further shown in detailed investigations that, when properly formed, sturdy metals can not only dramatically enhance module robustness while reducing thickness, but also provide opportunity for reducing manufacturing cost and enhancing stacking and combinatory assembly of different modules for new applications.

In one embodiment of the invention, the chip is flip-assembled on a metallic strap adhering to an insulating substrate. The assembly is inserted in the gap of a metal carrier, and the strap is conductively attached to the carrier. The carrier is designed to practically surround the chip, and has a thickness about equal to the chip thickness.

With this solution, the overall module thickness can be kept to less than 250 μm without dangerously thinning the chip (to less than 200 μm). The sturdy carrier increases the bending/flexure reliability of the module, and additional strength can be gained by filling any remaining gap between chip and carrier with molding compound. The metallic carrier further provides contact areas for higher level system interconnection by the customer (stacking of modules, stacking of chips). The flip-assembled chip further offers opportunities for attachment of heat sinks and thus very effective device cooling.

Another embodiment of the invention is a method for fabricating in mass production a low-cost Smart Card, which is ultra-thin, yet very robust. For the method, two reels with tapes are provided. The first reel is loaded with an insulating tape with adhering metal straps consisting of two halves separated by a hiatus. A semiconductor chip having a length is flip-assembled to span across each hiatus; the space under the span and the hiatus are then filled with an adhesive polymer compound.

The second reel is loaded with a metallic tape, for example a leadframe tape having a thickness about equal to the chip thickness. The metallic tape has rails, which hold carriers in the locations of the straps; a carrier consists of two portions separated by a gap at least equal to the chip length. Both tapes are fed into an assembly station, where they are aligned so that the carrier portions face the respective strap halves and the strap hiatus is about in the center of the carrier gap.

Permanent contacts are then formed between the aligned carrier portions and strap halves to create modules with the chip positioned in the carrier gap. The contact-forming methodology may be selected from techniques, which require no adhesives such as crimping, thermo-compressing, and ultrasonic welding; techniques based on isotropic conductive adhesives, such as conductive epoxies; techniques based on anisotropic conductive adhesives (conducting in z-direction only). The step of dispensing the adhesives is preferably followed by steps of pressing and heating.

Any space of the carrier gap not occupied by the assembled chip may be filled with encapsulation material, and thus strengthened, before the combined tapes are singulated into discrete modules.

The technical advances represented by certain embodiments of the invention will become apparent from the following description of the preferred embodiments of the invention, when considered in conjunction with the accompanying drawings and the novel features set forth in the appended claims.

BRIEF DESCRIPTION OF THE DRAWINGS

FIG. 1 is a schematic cross section of a Smart Card Module with the chip inserted in a gap of a metallic carrier according to an embodiment of the invention.

FIG. 2 is a schematic cross section of a Smart Card Module with the chip inserted in a gap of a metallic carrier according to another embodiment of the invention.

FIG. 3 is a schematic cross section of a Smart Card Module with the chip inserted in a gap of a metallic carrier according to yet another embodiment of the invention.

FIG. 4 is a schematic cross section of a Smart Card Module with the chip inserted in a gap of a metallic carrier according to yet another embodiment of the invention.

DETAILED DESCRIPTION OF THE PREFERRED EMBODIMENTS

Figure 5:
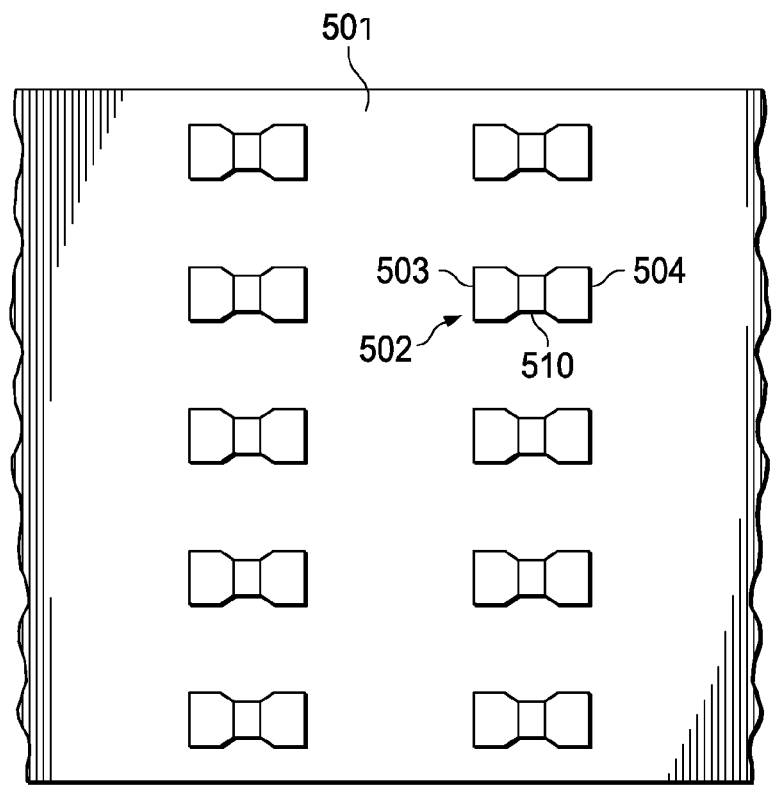
FIG. 5 shows a schematic top view of a portion of the insulating tape with adhering array of metallic straps; chips are attached to span between the strap halves.

A Smart Card module according to the embodiments of the invention includes a conductive elongated flat carrier structured as two portions surrounding a recess; the carrier material has a first thickness. A semiconductor chip of a second thickness is in the recess and has electrical connections of a height to the carrier portions. The sum of the second thickness and the connection height is approximately equal to the first thickness. Encapsulation compound fills the space of the recess not occupied by the chip.

With reference now to the figures and in particular with reference to FIG. 1, an embodiment of the invention is a Smart Card Module, generally designated 100 in FIG. 1, which includes a semiconductor chip 101. In other embodiments, two or more chips, or stacks of chips may be employed. Chip 101 has a first length 102, a first thickness 103, and metallic contact bumps of a height 106. The bumps are attached to chip surface 101a and are preferably grouped in sets located in separate sections of the chip surface. First metallic contact bumps 104 are clustered in one chip section, and second metallic contact bumps 105 are clustered in another chip section. It is preferred to array bumps 104 along one edge of chip 101, and bumps 105 along the opposite edge of chip 101 (in FIG. 1, only one bump is shown close to either edge).

Preferably, bumps 105 and 106 are made of gold; alternatively, copper or any other suitable metal or alloy may be used. In order to facilitate the attachment of the chips to a metallic strap, which is preferably made of aluminum (see below), bumps 105 and 106 preferably have a metallurgical surface configuration suitable for forming intermetallics or metal interdiffusion.

Module 100 in FIG. 1 further includes a substrate 110, which consists of an insulating bottom layer 111 and an adhering metal top layer 112. Preferred material for insulating bottom layer 111 is polyethylene terephthalate (PET) in the thickness range from about 25 to 75 •m; alternatively, other polymer compounds, such as polyimides, with suitable flexibility and strength may be used. Preferred metal for layer 112 is aluminum in the thickness range from about 5 to 25 •m; alternatively, copper may be used.

FIG. 1 indicates that insulting layer 111 is continuous throughout module 100, but metal layer 112 is patterned into a strap, which has a first half 112a and a second half 112b. The two halves are separated by a hiatus 113, which has a width smaller than the first length 102 of chip 101.

As FIG. 1 shows, module 100 further includes a metallic carrier 120. In the preferred embodiment, carrier 120 is a leadframe made of copper or a copper alloy with a second thickness in the range from about 80 to 250 μm. In any case, carrier 120 is sheet-like and has a second thickness 121 about equal to the sum of the first thickness (chip thickness) 103 and the bump height 106; in some embodiments, it may be thicker than the sum. Carrier 120 further is patterned into a first portion 120a and a second portion 120b. The two portions are separated by a gap 122, which has a width at least equal to the first length 102 of chip 101.

FIG. 1 illustrates that metallic carrier 120 is in electrical contact with conductive layer 112 of substrate 110. The contact is established so that first carrier portion 120a rests on first strap half 112a, and second carrier portion 120b rests on second strap half 112b. Furthermore, hiatus 113 is approximately in the center of gap 122. As a consequence, insulating layer 111, which extends across hiatus 113, also bridges gap 122 and thus extends across the whole module 100.

In some embodiments, the electrical contact between the metals of carrier portion 120a and strap half 112a, and of carrier portion 120b and strap half 112b can be provided by thermo-compression or ultrasonic welding without an adhesive layer. In the embodiment illustrated in FIG. 1, however, an adhesive layer 130 is shown to establish the interconnection. Layer 130 is electrically conductive. To achieve the conductivity, the material of layer 130 may be an isotropic conductive adhesive, such as an epoxy-based compound filled with metallic particles (for instance, silver particles). Alternatively, anisotropic conductive adhesives may be used, which conduct only in z-direction.

As FIG. 1 depicts, chip 101 is in electrical contact with the substrate so that the first length 102 of chip 101 is within the carrier gap 122, the first chip bumps 104 are contacting the metallic first strap half 112a and the second chip bumps 105 are contacting the metallic second strap half 112b. The bump-to-metal contact is preferably formed (see below) by thermo-compression bonding, possibly with support from ultrasonic energy. Based on the grouping of the bumps into sets, chip 101 spans over the hiatus 113 between the strap halves 112a and 112b.

The span of chip 101 creates a space, which is preferably filled with an insulating adhesive polymer 140. In addition to the space under the assembled chip, the compound fills the hiatus 113. Preferably, a polymeric precursor is employed, which polymerizes at elevated temperatures.

As shown in FIG. 1, any space of the carrier gap 122, which is not occupied by chip 101, is preferably filled with an encapsulation compound 150, for example an epoxy-based molding compound, which hardens by polymerization and thus provides strength and robustness to the module 100. In addition, compound 150 offers great adhesion to the chip 101 and to the carriers, especially when they are made of copper (molding compound adheres very well to copper oxide). Compound 150 thus promotes module coherence and prevents delamination of the module parts, with would otherwise pose a risk of subsequent moisture ingress, corrosion, and reliability failures.

FIG. 1 points out the fact that, due to the insertion of chip 101 into the gap 122 of the carrier 120, it is the thickness 121 of the carrier, which practically determines the overall thickness 160 of the module. Consequently, module thickness 160 can be kept to less than 250 μm without dangerously thinning chip 101 (thickness 103 to less than 200 μm).

In some embodiments, encapsulation compound 150 leaves the chip surface 101b exposed (free of compound). This approach is preferred when additional means are needed to enhance heat transport and heat dissipation. The approach is particularly preferred in order to attach a heat sink to the exposed chip surface.

In yet other embodiments, it may be desirable to have the encapsulation surface be coplanar with the carrier surface 120b. In yet other embodiments, it may be desirable to extend the encapsulation compound over the assembled chip and further over carrier portions near the gap. An example of a compound extension is illustrated in FIG. 1 and designated 151. With these extensions, the modules exhibit enhanced mechanical strength and robustness.

It is useful to leave enough metal surface of the carrier un-encapsulated and available for vertical interconnection of modules (stacking). In FIG. 1, the exposed surface of carrier portion 120a is designated 123, and the exposed surface of carrier portion 120b is designated 124.

FIGS. 2, 3 and 4 illustrate other embodiments of the invention. In FIG. 2, the module generally designated 200 has a two-sided encapsulation. The encapsulation portions 250 and 251 fill remaining gap space and form extensions over gap-near carrier portions similar to the portions 150 and 151 in FIG. 1. Further, the encapsulation compound forms a layer 253 on the insulating layer 211 of the substrate and is further anchored to the metallic carrier by filling openings 260 in substrate 210. These openings 260 extend through the insulating (211) and metallic (212) layers of substrate 210 as well as through any adhesive layer 230 to expose metal of the carrier portions 220a and 220b.

In the embodiment of FIG. 3, generally designated 300, substrate 310 is patterned so that strap 312 has a second length 314 greater than the first length 102 of the chip. In addition, carrier 320 has a third length 325 greater than the second length 314. Consequently, there is enough surface 326 of carrier 320 available for module-to-module interconnection and stacking. Since encapsulation compound 350 forms only extensions 351 over the gap-near portions of carrier 320, there remains enough metallic surface 327 of carrier 320 available to permit module stacking also on top of module 300.

The embodiment illustrated in FIG. 4, generally designated 400, combines the feature of the patterned substrate 410 with the feature of the two-sided encapsulation (450 and 454) The additional amount of encapsulation material (450, 451, and 454) provides enhanced robustness to module 400, and the exposed metal on both carrier surfaces (426 and 427) provides opportunity for stacking of modules.

Another embodiment of the invention is a method for fabricating a Smart Card module in mass production and at low cost. The method starts by providing a plurality of semiconductor chips. The chips have a first length (which, in a later process step, will set a minimum width for the gap of the metallic carrier) and a first thickness, which is preferably 200 µm or more. Since the chip will be inserted in a later process step into the gap of the carrier, it does not have to be dangerously thinned, for example to less than 200 µm. The chips have metallic bumps as electrical contacts.

Preferably, the bumps are grouped in sets located in separate sections of the chip surface. First metallic contact bumps are clustered in one chip section, and second metallic contact bumps are clustered in another chip section, with an area free of bumps in between. It is preferred to array the first bumps along one edge of chip, and the second bumps along the opposite edge of chip 101.

The preferred metal for the bumps is gold, alternatively they may be made of copper or a copper alloy. The preferred method for bump formation is electroplating, because the electroplating of numerous chips on a whole semiconductor wafer may be executed simultaneously as a batch process. If there is a need for special bump, the bumps may be created by a modified ball bonding technique, which works well for both aluminum and copper metallization of the chip contact pads. In this fabrication method, the bumps may have the shape of deformed spheres. At the interface between gold and aluminum are layers of mechanically strong gold/aluminum intermetallics (for copper bumps, the layers include copper/aluminum intermetallics). Ball bonding does not require photomasks, but rather commercially available bonders, whose computer-control can be adjusted to any ball size, pitch, and sequence.

A wire bonder with a capillary is selected suitable for round gold wires in the diameter range between 15 and 33 µm, preferably 20 to 25 µm. From the length of the gold wire protruding from the capillary, a free air ball is formed using either a flame or a spark technique. The ball has a size with a preferred diameter from about 1.2 to 1.6 wire diameters, for example, between about 20 and 30 µm.

For bonding gold to an aluminum metallization on the chip, the chip is positioned on a pedestal heated to a temperature between 150 and 300° C. The free air ball is placed on the contact pad and pressed against the metallization of the pad. For pads of aluminum, a combination of compression force and ultrasonic energy creates the formation of gold-aluminum intermetallics and a strong metallurgical bond. The compression force is between about 17 and 75 g; the ultrasonic time between about 10 and 20 ms, the ultrasonic power between about 20 and 50 mW. At time of bonding, the temperature usually ranges from 150 to 270° C. The squeezed gold bump 105 looks like a deformed sphere.

The capillary is lifted and the wire is broken off from the squeezed sphere in the heat-affected mechanically weak zone. The wire stump remaining of the squeezed ball may be coined to flatten it. Dependent on the shape of the capillary orifice, the bumps may have an additional truncated cone with a flat top or a small additional wire length attached.

Next, a first reel is provided with an insulating tape carrying an adhering metal layer. A portion 501 of the tape is illustrated in FIG. 5. Preferred material for the insulating tape is polyethylene terephthalate (PET) in the thickness range from about 25 to 75 µm. The metal layer is preferably aluminum in the thickness range from about 5 to 25 µm. The metal is configured as an array of straps 502 in strap locations. Each strap consists of a first half 503 and a second half 504 separated by a hiatus (not shown in FIG. 5, the hiatus is under chip 510); the width of the hiatus is smaller than the first length of the chip 510.

In the next process step, one chip 510 is assembled to each strap 502 by attaching the set of first bumps to the first strap metal half 503, and the set of second bumps to the second strap half 504. The attachment is performed so that the chip spans over the hiatus, as depicted, for example, in FIG. 1.

Next, the space under the chip span and the strap hiatus are filled with an insulating adhesive polymer compound. A preferred technique uses a polymeric precursor, which is pulled by capillary action into the space to fill the space and the strap hiatus without voids. The precursor is then polymerized at temporarily elevated temperatures. Next, the insulating tape with the assembled chips is reloaded onto the first reel.

Figure 6:
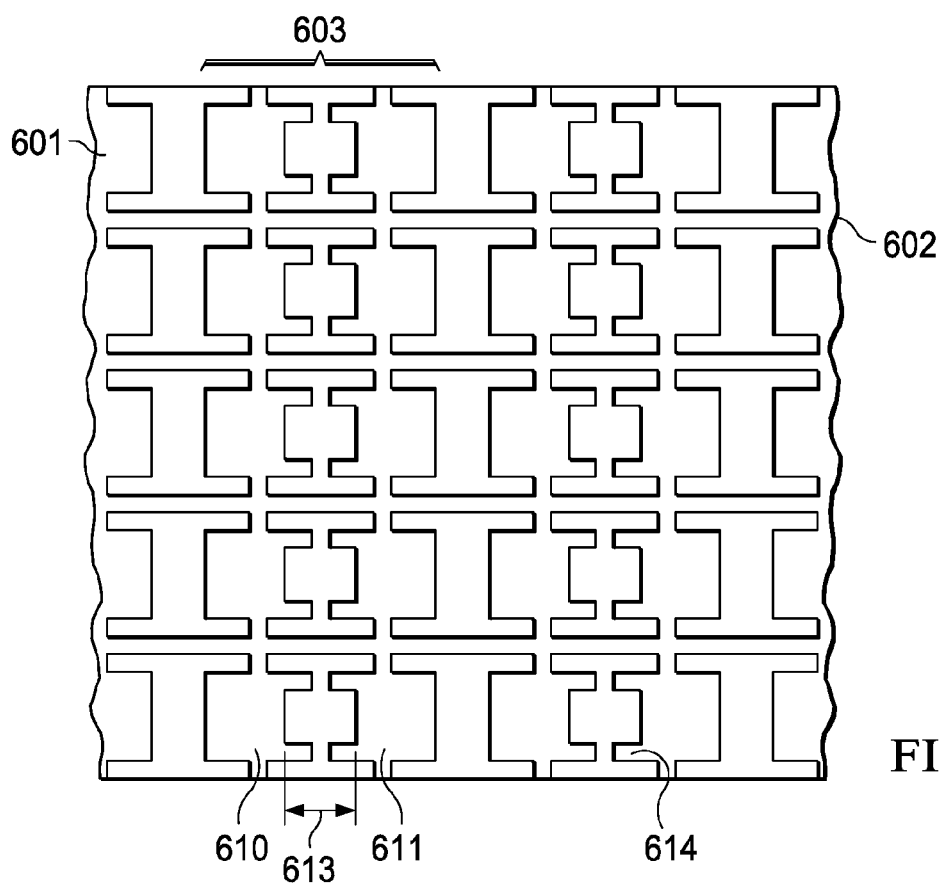
FIG. 6 shows a schematic top view of a portion of the metallic carrier tape.

In the next process step, a second reel loaded with a metallic tape is provided. A portion 601 of the tape is illustrated in FIG. 6. As can be seen in this top view, tape 601 is patterned as rails 602 holding carriers 603. The carriers are in the locations of the straps 502 in FIG. 5. As FIG. 6 further shows, each carrier consists of a first portion 610 and a second portion 611 separated by a gap 613. The width of gap 613 is at least equal to the first length 102 of chip 101 (see FIG. 1); for many Smart Cards, first length 102 of the chips is between about 100 and 5000 µm so that gap 613 has to be greater than the respective chip length. The design of carrier 603 in FIG. 6 also indicates that it is advantageous for many embodiments to add protrusions 614 to the portions 610 and 611. These metallic protrusions physically protect the assembled chip in the gap 613 (the protrusions are not shown in the cross sections FIGS. 1 to 4). The geometrical shape (such as length, width, angles) of protrusions 614 can be designed to suit any chip size; in some embodiments, protrusions are not needed and are thus omitted.

It has been pointed out in FIG. 1 that metallic tape 601 has a second thickness 121, which is about equal to the sum of the first thickness 103 of chip 101 and the height 106 of bumps 105. Thickness 121 is between about 80 and 250 µm; it represents the dominating portion of the Smart Card total thickness.

Figure 7:
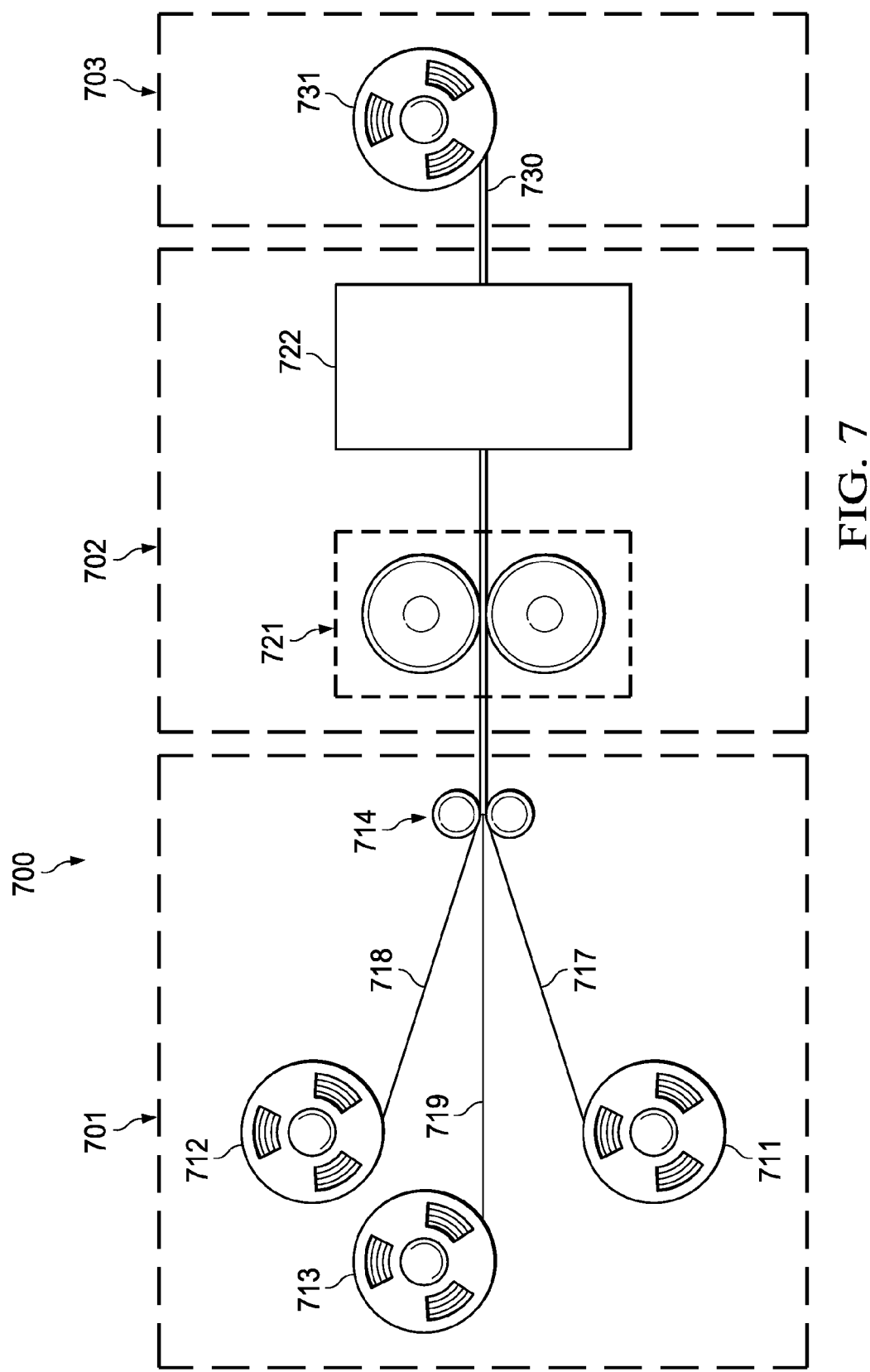
FIG. 7 is a schematic diagram of the assembly station.

In the next process step, indicated by the example depicted in FIG. 7, an assembly station, generally designated 700, is provided to perform a sequence of strap-to-carrier assembly steps for mass producing Smart Cards. Station 700 includes unit 701, which provides the inputs for the lamination, unit 702, which executes the lamination and packaging steps, and unit 703, which delivers the output of the packaged Smart Card modules. While piece parts and certain equipments are commercially available (see below), the process flow and process details are enabled by the features of the invention.

Input unit 701 includes a first reel 711 loaded with the insulating tape 717 attached with the array of the metallic straps and the assembled semiconductor chips. Unit 701 further includes a second reel 712 loaded with the metallic tape 718 structured as the carriers for the assembled straps. For the assembly of some embodiments, it is practical to perform certain process steps (see below) with the help of a third reel 713 loaded with a patterned adhesive film 719. Unit 701 further includes drive mechanism 714 (for instance, sprocket wheels), which feeds the chip-assembled insulating tape 717 and the metallic tape 718 (and, in some process flows, the adhesive film 719) concurrently into unit 702.

Reel-to-reel equipments are commercially available by a number of vendors, notably Mühlbauer, Germany; Toray, Japan; and Mark Andy, USA. These companies also offer modifications so that two-reel and three-reel installations can be implemented.

Lamination and packaging unit 702 includes machine 721 for aligning and attaching straps and carriers, and machine 722 for in-line encapsulation. For the performing the alignment in machine 721, each carrier of tape 718 is aligned over the respective strap of tape 717 so that the first carrier portion faces the first strap half, the second carrier portion faces the second strap half, and the strap hiatus, spanned by the assembled chip, is approximately in the center of the carrier gap. Controls have to insure that the tolerances of carriers and straps, especially of the strap hiatus and the carrier gap, allow the processing of a multitude of units, before any disturbing misalignments require new alignment.

For performing the attachment in machine 721, permanent contact between the aligned carrier portions and strap halves needs to be formed. Several methods are successful:

First, thermocompression or ultrasonic welding. For this method, adhesive does not have to be used.

Second, crimping of the aligned strap halves with the respective carrier portions. The insulating PET tape with the thin aluminum strap metallization is very suitable for this technique. This method is low cost.

Third, applying a conductive adhesive compound on the first and second halves of each strap. One method of application is by a dispense technique; another method is by stencil printing; yet another method is by jetting. The conductive adhesive compound is selected from a group including isotropically conductive adhesives (such as an epoxy-based silver-filled compound) and anisotropically conductive adhesives (which conduct only in z-direction). The latter option has the advantage that no patterning or application in specific areas is required to prevent shorting of the terminals.

Next, each carrier and the respective strap are pressed together, preferably using rollers which can guide and advance the tapes between them while applying pressure onto the carriers and straps after they are freshly brought into contact.

Heat is applied while the carrier and respective strap are pressed together in order to expedite the attachment process. Thereafter, the elevated temperature is cooled again to ambient temperature; each carrier portion is attached to the respective strap half.

As indicated in FIG. 7, a preferred low cost and precision method of applying a conductive adhesive compound is by the steps of providing the third reel 713 loaded with a patterned adhesive film; positioning the third reel so that the adhesive film 719 is fed by mechanism 714 into the assembly station 721 between the insulating tape 717 and the conductive tape 718; and aligning the patterned adhesive film so that the first and second strap halves of the assembled insulating tape become adhesive before pressing the conductive tape against the insulating tape.

In a modification of the above described processes, the conductive adhesive compound can be applied to the first and second carrier portions, rather than on the strap. One method of application is by a dispense technique; another method is by stencil printing; yet another method is by jetting. The preferred low cost and precision method of applying a conductive adhesive compound is by the steps (see FIG. 7) of providing the third reel 713 loaded with a patterned adhesive film; positioning the third reel so that the adhesive film 719 is fed by mechanism 714 into the assembly station 721 between the insulating tape 717 and the conductive tape 718; and aligning the patterned adhesive film so that the first and second strap halves of the assembled insulating tape become adhesive before pressing the conductive tape against the insulating tape.

Again, the conductive adhesive compound is selected from a group including isotropically conductive adhesives (such as an epoxy-based silver-filled compound) and anisotropically conductive adhesives (which conduct only in z-direction). Each strap and the respective carrier are then pressed together while applying heat. Thereafter, the assembly is cooled to ambient temperature, and each carrier portion is attached to the respective strap half.

In the next process step, the joint tapes with the assembled array are fed into the encapsulation machine 722, such as an in-line molding equipment, in order to be packaged. Encapsulation material (for instance, epoxy-based molding compound with inorganic fillers) is filling any space of the carrier gap, which is not occupied by the assembled chip. After polymerization, the hardened compound bestows robustness and mechanical strength upon the packaged module.

The packaged tapes 730 exit the encapsulation machine 722 and may be collected on reel 731 in unit 703 for further processing (such as transportation of singulation).

Figure 8:
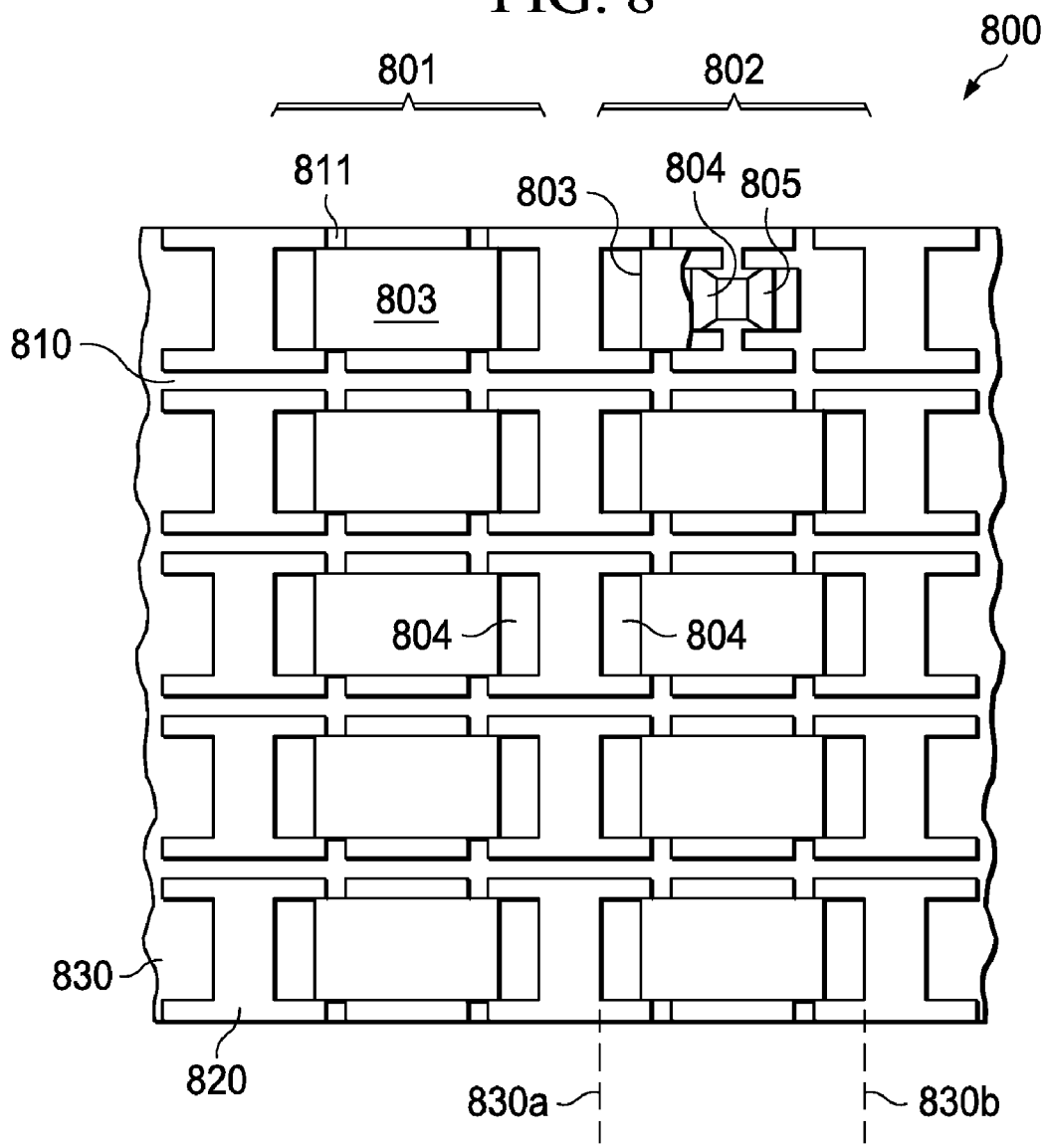
FIG. 8 shows a schematic top view of a portion of the assembled and packaged insulating tape and carrier tape, displaying the array of encapsulated modules.

FIG. 8 illustrates a portion of the packaged array, generally designated 800, including the insulating pate 820 and the metallic tape 830. A plurality of packaged units 801 is shown; one packaged unit 802 is depicted in see-through view. In FIG. 8, the inner portions of the units exhibit the encapsulations 803, and the outer portions are the un-encapsulated metallic carrier areas 804 for electrical interconnection to the next level assembly. The see-through unit reveals the first (804) and second (805) halves of the strap and the assembled chip 806.

In the last process step, the combined tapes are trimmed by severing the supporting rails 810 and 811, and by cutting the insulating tape 820 at the exposed edges 830a and 830b of the carrier portions. The severing and cutting singulates the assembled modules 800 into discrete modules 801, 802, etc.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the invention applies to products using any type of semiconductor chip, discrete or integrated circuit, and the material of the semiconductor chip may comprise silicon, silicon germanium, gallium arsenide, or any other semiconductor or compound material used in integrated circuit manufacturing.

As another example, the semiconductor chip may have more contact bumps if the carrier halves are electrically interdigitated. As another example, it may be advantageous for some products to process chips individually rather than in a batch process using the tapes described.

It is therefore intended that the appended claims encompass any such modifications or embodiment.

We claim:

1. A Smart Card chip module comprising:
    a semiconductor Smart Card chip having a first length, a width, a first thickness, and first and second metallic contact bumps of a height;
    a substrate consisting of an insulating bottom layer and an metal top layer adhering continuously to the insulating bottom layer, the metal layer patterned into a strap having a first and a second half separated by a hiatus smaller than the first length;
    a sheet-like metallic carrier, the carrier having a second thickness about equal to the sum of the first thickness and the bump height, the carrier patterned into a first and a second portion separated by a gap having a width at least equal to the first length for receiving the chip wherein a top of the carrier is substantially the same height from the substrate as the mounted chip;
    the carrier conductively contacting the substrate so that the first carrier portion rests on and is electrically connected to the first strap half, the second carrier portion rests on and is electrically connected to the second strap half, and the hiatus is approximately in the center of the gap, wherein the insulating substrate layer bridges the carrier gap;
    the chip in contact with the substrate so that the first length is within the carrier gap, the first bumps contacting the first strap half and the second bumps contacting the second strap half, wherein the chip spans over the hiatus between the halves and wherein the chip is electrically connectable to an external circuit via the strap and the carrier;
    an adhesive polymer compound filling the space under the chip span and filling the hiatus; and
    an encapsulation compound filling any space of the carrier gap not occupied by the chip.

2. The module of claim 1 further including metal lips protruding from the carrier portions so that the lips surround at least portions of the chip width.

3. The module of claim 1 wherein the strap further has a second length greater than the first length, and the carrier further has a third length greater than the second length.

4. The module of claim 1 wherein the carrier is a metallic leadframe.

5. The module of claim 4 wherein the leadframe includes copper and the second thickness ranges from about 80 to 250 μm.

6. The module of claim 1 wherein the encapsulation compound is a polymerized molding compound.

7. The module of claim 1 further including a layer of the encapsulation compound extending over the assembled chip and over carrier portions near the gap.

8. The module of claim 1 further including a layer of the encapsulation compound extending under the insulating bottom layer of the substrate and under carrier portions near the substrate strap.

9. The module of claim 1 wherein the bumps are made of gold.

10. The module of claim 1 wherein the chip first thickness is between about 75 and 225 μm and the chip first length is in the range from about 100 to 5000 μm.

11. A Smart Card chip module comprising:
    a semiconductor Smart Card chip having a first length, a width, a first thickness, and first and second metallic contact bumps of a height;
    a substrate consisting of an insulating bottom layer and an metal top layer adhering continuously to the insulating bottom layer, the metal layer patterned into a strap having a first and a second half separated by a hiatus smaller than the first length;
    a sheet-like metallic carrier, the carrier having a second thickness about equal to the sum of the first thickness and the bump height, the carrier patterned into a first and a second portion separated by a gap having a width at least equal to the first length;
    the carrier conductively contacting the substrate so that the first carrier portion rests on and is electrically connected to the first strap half, the second carrier portion rests on and is electrically connected to the second strap half, and the hiatus is approximately in the center of the gap, wherein the insulating substrate layer bridges the carrier gap;
    the chip in contact with the substrate so that the first length is within the carrier gap, the first bumps contacting the first strap half and the second bumps contacting the second strap half, wherein the chip spans over the hiatus between the halves and wherein the chip is electrically connectable to an external circuit via the strap and the carrier;
    an adhesive polymer compound filling the space under the chip span and filling the hiatus; and
    an encapsulation compound filling any space of the carrier gap not occupied by the chip, wherein the insulating bottom layer of the substrate is made of polyethylene terephthalate (PET) in the thickness range from about 25 to 75 μm, and the metallic top layer is made of aluminum in the thickness range from about 5 to 25 μm.

12. A method for fabricating a Smart Card module comprising the steps of:
    providing a plurality of semiconductor chips having a first length, a first thickness, and first and second metallic contact bumps of a height;
    providing a first reel loaded with an insulating tape having an adhering metal layer configured as an array of straps in strap locations, each strap consisting of a first and a second half separated by a hiatus smaller than the first length;
    assembling one chip to each strap by attaching the first bumps to the first metal half and the second bumps to the second metal half so that the chip spans over the hiatus;
    filling the space under the chip span, and the strap hiatus, with an adhesive polymer compound;
    re-loading the first reel with the assembled insulating tape;

providing a second reel loaded with a metallic tape patterned as rails holding carriers in the strap locations, each carrier consisting of a first and a second portion separated by a gap of a width at least equal to the first length, the metallic tape having a second thickness about equal to the sum of the first thickness and the bump height;

providing an assembly station to perform the steps of:

feeding the assembled insulating tape and the metallic tape concurrently through the equipment;

aligning each carrier over the respective strap so that the first carrier portion faces the first strap half, the second carrier portion faces the second strap half, and the strap hiatus, spanned by the chip, is approximately in the center of the carrier gap;

forming permanent contacts between the aligned carrier portions and strap halves to create modules with the chip positioned in the carrier gap;

filling encapsulation material into any space of the carrier gap not occupied by the assembled chip, thereby creating assembled modules; and trimming the combined tapes by severing the supporting rails and cutting the insulating tape at the exposed edges of the carrier portions, thereby singulating the assembled modules into discrete modules.

13. The method of claim 12 wherein the step of forming permanent contacts is selected from a group of steps including:

crimping the aligned strap halves with the respective carrier portions;

dispensing a conductive adhesive compound on the first and second halves of each strap;

pressing each carrier and the respective strap together while applying heat, thereby attaching each strap half to the respective carrier portion; and cooling the attached straps and carriers; and dispensing a conductive adhesive compound on the first and second carrier portions;

pressing each strap and the respective carrier together while applying heat, thereby attaching each carrier portion to the respective strap half; and cooling the attached carriers and straps.

14. The method of claim 12 further including the step of extending a layer of the encapsulation compound over the assembled chip and over certain carrier portions near the gap, while leaving carrier portions remote from the gap un-encapsulated, whereby the un-encapsulated carrier portions are available for electrical interconnection to the next level assembly.

15. The method of claim 12 further including the step of extending a layer of the encapsulation compound under the insulating bottom layer of the substrate and under certain carrier portions near the substrate strap, while leaving carrier portions remote from the gap un-encapsulated, whereby the un-encapsulated carrier portions are available for electrical interconnection to the next level assembly.

16. The method of claim 12 wherein the step of filling encapsulation compound employs a molding equipment and a polymerizable epoxy-based molding compound.

17. The method of claim 12 wherein the insulating tape is patterned so that portions of the carrier halves remote from the gap remain without substrate and thus available for electrical interconnection of the discrete module to the next level assembly.

18. The method of claim 12 wherein the conductive tape is a tape of metallic leadframes including rails and carriers.

19. The method of claim 12 wherein the insulating tape is made of PET and the metallic straps are made of aluminum.

20. The method of claim 12 wherein the assembly station includes rollers to guide and advance the tapes between them and to apply pressure onto the carriers and straps while freshly brought into contact.

21. The method of claim 13 wherein the step of dispensing a conductive adhesive compound is performed by the steps of:

providing a third reel loaded with a patterned adhesive film;

positioning the third reel so that the adhesive film is fed into the assembly station between the insulating tape and the conductive tape; and aligning the patterned adhesive film so that the first and second strap halves of the assembled insulating tape become adhesive before pressing the conductive tape against the insulating tape.

22. The method of claim 13 wherein the conductive adhesive compound is selected from a group including isotropically conductive adhesives and anisotropically conductive adhesive.

\* \* \* \* \*